(12) United States Patent
Lehane et al.

(10) Patent No.: US 10,235,339 B2
(45) Date of Patent: Mar. 19, 2019

(54) DIGITAL MEASUREMENT INSTRUMENT TRIGGERED BY SIGNAL PATTERN

(71) Applicant: Keysight Technologies, Inc., Minneapolis, MN (US)

(72) Inventors: Andrew Robert Lehane, Edinburgh (GB); Antony Kirkham, Edinburgh (GB); Martin Ware Curran-Gray, South Queensferry (GB)

(73) Assignee: Keysight Technologies, Inc., Santa Rosa, CA (US)

( * ) Notice: Subject to any disclaimer, the term of this patent is extended or adjusted under 35 U.S.C. 154(b) by 1197 days.

(21) Appl. No.: 13/770,099

(22) Filed: Feb. 19, 2013

(65) Prior Publication Data

US 2014/0236539 A1 Aug. 21, 2014

(51) Int. Cl.
*H03F 1/26* (2006.01)
*G06F 17/00* (2019.01)
*G01R 13/02* (2006.01)

(52) U.S. Cl.
CPC ......... *G06F 17/00* (2013.01); *G01R 13/0254* (2013.01); *G01R 13/0272* (2013.01)

(58) Field of Classification Search
CPC ............ G01R 13/0272; G01R 13/0254; G05B 19/045; G06N 5/047
USPC ........................ 702/127, 189, 190
See application file for complete search history.

(56) References Cited

U.S. PATENT DOCUMENTS

| | | | |
|---|---|---|---|
| 6,301,547 B2 * | 10/2001 | Felps ..................... | G01R 13/22 702/66 |
| 6,624,829 B1 | 9/2003 | Beck et al. | |
| 7,332,929 B1 | 2/2008 | Normoyle et al. | |
| 7,333,964 B2 | 2/2008 | Dippon | |
| 8,298,835 B2 | 10/2012 | Wang et al. | |
| 8,332,697 B1 | 12/2012 | Peattie | |
| 2005/0225310 A1 * | 10/2005 | Smith .................... | G01R 13/32 324/121 R |
| 2006/0179354 A1 * | 8/2006 | Dippon .................... | G06F 7/02 714/39 |
| 2007/0222430 A1 * | 9/2007 | Sullivan ............. | G01R 13/0254 324/76.15 |
| 2008/0186023 A1 * | 8/2008 | Biziere .................. | G01R 33/09 324/252 |

(Continued)

FOREIGN PATENT DOCUMENTS

| | | |
|---|---|---|
| CN | 101086510 A | 12/2007 |
| EP | 2336790 A1 | 6/2011 |
| WO | 2007112360 A2 | 10/2007 |

OTHER PUBLICATIONS

De Lucas, et al. "Luminescence lifetime measurements from spectrofluorimeters employing low-cost analog input interfaces", DCITTYM (Sección Ciencias de Materiales), Facultad de Ciencias, Universidad de Cantabria, 39005 Santander, Spain, vol. 61, Issue 1, p. 23-26.

(Continued)

*Primary Examiner* — An Do

(57) ABSTRACT

A measurement instrument receives an analog input signal from a measurement target, converts the input signal into a digital signal, scans the digital signal and comparing the scanned digital signal with a pattern signature using a flexible matching procedure implemented by hardware, and triggers the measurement instrument according to a result of the flexible matching procedure.

20 Claims, 9 Drawing Sheets

(56) References Cited

U.S. PATENT DOCUMENTS

| | | |
|---|---|---|
| 2009/0281748 A1 | 11/2009 | Cake et al. |
| 2010/0223582 A1* | 9/2010 | Dods .................. G06F 1/1694 |
| | | 715/863 |
| 2011/0047427 A1 | 2/2011 | Bailey et al. |
| 2011/0134979 A1* | 6/2011 | Rule .................. G01R 13/0254 |
| | | 375/224 |
| 2011/0166813 A1 | 7/2011 | Kelly |
| 2012/0173188 A1 | 7/2012 | Cake et al. |
| 2012/0306886 A1 | 12/2012 | Bernard et al. |

OTHER PUBLICATIONS

Xiao Yan, et al. "A New Signal Capture Method Based on Real-Time Multi-Domain Trigger in Communication Analyzer", IEEE Circuits and Systems International Conference on Testing and Diagnosis, 2009. ICTD 2009.

Fleischheuer, H.P. "Filling the gap: portable oscilloscope captures communication signals accurately", Source: Elektronik Praxis, v 32, n 11, 38-40, 42, Jun. 6, 1997; Language: German; ISSN: 0341-5589; Publisher: Vogel-Verlag, Germany.

Zahedi, et al. "PC-based, low cost 3-D medical ultrasonic imaging", Engineering in Medicine and Biology Society, 1995.

Co-pending U.S. Appl. No. 13/600,112, filed Aug. 30, 2012.

Office Action dated Oct. 11, 2017 for Chinese Patent Application No. 201410023010.7, 19 pages [unofficial/non-certified English language translation provided by foreign agent included].

Chinese Office Action dated Jun. 27, 2018 with English translation.

Chinese Supplemental Search Report.

\* cited by examiner

DIGITAL MEASUREMENT INSTRUMENT TRIGGERED BY SIGNAL PATTERN

BACKGROUND

A digital measurement instrument is used to measure and/or observe electrical signal properties. As an example, a digital oscilloscope can be used to capture and display a snapshot of an electrical signal in order to allow a user to observe features such as signal shape, amplitude, and so on. In oscilloscopes and other digital measurement instruments, a trigger may be used to determine when a desired portion of a signal is captured for measurement, display, and/or analysis. Such a trigger may be fired, for instance, upon detecting a recognizable event such as a transitioning signal edge or certain types of glitches.

FIG. 1 illustrates a simplified example of a digitizing oscilloscope 100 in order to show how triggering occurs in some conventional contexts. As illustrated in FIG. 1, oscilloscope 100 comprises a signal conditioner 105, an analog to digital converter (ADC) 110, a memory 115, a processor 120, a display 125, a trigger 130, and a timebase 135.

Signal conditioner 105 receives an analog input signal, typically through an oscilloscope probe, and performs signal conditioning operations such as vertical scaling. ADC 110 receives the analog input signal from signal conditioner 105 and samples and digitizes the signal to produce a digital input signal. ADC 110 then stores the digital input signal in memory 115 for subsequent presentation on display 125. Trigger 130 analyzes the analog input signal to detect a trigger event, and timebase 135 adjusts the timing of display 125 according to the detected event. Processor 120 performs any required post-processing on the stored digital input signal. Display 125 then presents a portion of the digital input signal in response to the detected trigger event.

In most modern oscilloscopes, triggering can be performed in a variety of different ways. For example, it can be performed using different trigger modes, such as an auto sweep mode, a single sweep mode, and a trigger sweep mode. The auto sweep mode is generally used where the user is unsure how to setup the trigger conditions or for DC waveforms, and it forces the oscilloscope to trigger in the absence of a trigger condition, giving glimpses of a waveform. The single sweep mode facilitates the capture of single-shot events such as glitches without subsequent waveform data overwriting the display. The trigger sweep mode updates the display only when a trigger event occurs. The oscilloscope waits until a trigger condition occurs before it displays any sampled waveform data; it is then re-armed automatically and a next segment of data is captured. This mode is commonly used to view repeating waveforms. One of the main differences between the single sweep and trigger sweep modes is that that the former does not re-arm and redisplay but stops after the first trigger.

Various different types of triggers can be used within each of the above modes. Examples of such triggers include edge triggers, edge transition triggers, edge-to-edge triggers, pulse width triggers, glitch triggers, state triggers, runt triggers, timeout triggers, TV mode triggers, set up and hold mode triggers, window mode triggers, and communication mode triggers, to name but a few. In addition, trigger functionality can be modified by additional mechanisms, such as an AND qualifier, a hold off time, or a sensitivity setting. The AND qualifier performs a logical AND operation on the triggers of one or more channels. The hold off time sets an amount of time that the oscilloscope waits before re-arming its trigger circuitry. This can be used, for example, to trigger on a first pulse among a burst of pulses, but not on the remaining pulses. The sensitivity setting is typically adjusted based on hysteresis in trigger circuitry to prevent incorrect double-triggering on low bandwidth waveforms. A low sensitivity setting is typically used for all waveforms of 4 GHz or below.

The above triggers are typically implemented in hardware based trigger circuitry. For example they can be implemented in a circuit within trigger 130 of FIG. 1. Nevertheless, triggers can also be implemented in software to allow a user or developer to specify more complex and/or flexible triggering functions. For example, certain triggers can be implemented by executing software on processor 120 to examine digital data stored in memory 115. Several examples of such triggers are implemented by Agilent's InfiniiScan software. They include a "measurement finder" trigger, a "zone qualify finder" trigger, a "generic serial pattern finder" trigger, a "non-monotonic edge finder" trigger, and a "runt finder" trigger.

By comparison with hardware based triggers, software triggers tend to offer more flexibility, functionality, and control over the functionality. For example, the Infiniiscan runt finder trigger offers hysteresis control, whereas a hardware based runt finder trigger generally does not. However, software triggers are generally dependent on hardware triggers; e.g., they are usually armed immediately after the hardware trigger or after a certain time delay. This functionality provides a two-level sequencer, hardware trigger followed by software finder with a specified delay between events. In addition, software triggers tend to be much slower than hardware triggers, which results in significant amount of dead-time where the oscilloscope is not able to look for a next trigger event. This dead-time makes it unlikely that a software trigger will fire on a rare event over a short period of time. Dead-time also exists in hardware triggers, but it tends to be less than in software triggers although for very fast waveforms when searching for rare events dead time may still be significant.

FIG. 2 is a diagram illustrating the concept of dead-time in an oscilloscope. As illustrated in FIG. 2, the oscilloscope receives an input signal, and it arms a trigger at vertical lines labeled "Trigger". During a first interval labeled "Acq Time", the trigger waits for a trigger event, which occurs in this example at a time indicated by a dotted vertical line. Upon detecting the trigger event, the trigger is fired. Thereafter, in an interval labeled "Dead Time", oscilloscope data is captured, stored, analyzed, and processed for display. These operations take time, and they vary as a function of various factors, such as memory depth, sampling rate, and waveform update rate. In some conventional oscilloscopes, for instance, dead time may occupy as much as 99% of the total operating time. During the dead time, the oscilloscope does not analyze incoming data, so it is essentially "blind". Accordingly, it is likely that an oscilloscope will fail to detect rare events unless it operates over a relatively long time period.

In view of the above shortcomings of conventional hardware and software based triggers, there is a general need for triggers capable of providing improved flexibility while maintaining adequate performance.

SUMMARY

In a representative embodiment, a method of operating a measurement instrument comprises receiving an analog input signal from a measurement target, converting the input signal into a digital signal, scanning the digital signal and comparing the scanned digital signal with a pattern signature using a flexible matching procedure implemented by hardware, and triggering the measurement instrument according to a result of the flexible matching procedure.

In some embodiments, the digital signal is scanned in real-time as it exits an ADC used to convert the input signal into the digital signal, and is scanned prior to storage in a memory. In other embodiments, the digital signal is stored in a deep memory of the measurement instrument and scanned in the deep memory. The digital signal may comprise, for instance, time-sequence voltages. In addition, the pattern signature may be defined in terms of a rate of change (dv/dt) of digital data against time, and the flexible matching procedure may perform matching by identifying patterns of the rate of change in the digital signal.

In some embodiments, the flexible matching procedure comprises evaluating the digital signal with respect to a regular expression defining the pattern signature. The regular expression may have a length proportional to a number of digital samples in a portion of the scanned digital signal to be matched by the flexible matching procedure. In some other embodiments, the flexible matching procedure aligns the digital signal with the pattern signature using a local alignment algorithm such as a Smith-Waterman algorithm or a Needleman-Wunsch algorithm.

In some embodiments, the method further comprises determining a phase alignment of the flexible matching procedure relative to the digital signal, and arming a trigger of the measurement instrument upon achieving successful phase alignment. Determining the phase alignment of the flexible matching procedure may comprise, for instance, comparing multiple instances of the pattern signature with the digital signal to identify an instance having phase alignment with the signal pattern, wherein the instances of the pattern signature are phase-shifted with respect to each other. The instances of the pattern signature may be compared with the digital signal in parallel.

In some embodiments, the measurement instrument is triggered upon detecting a mismatch between the pattern signature and the digital signal. Moreover, in some embodiments, the method further comprises arming a first trigger to be fired in response to a first event detected by hardware of the measurement instrument, and in response to the arming of the first trigger, arming a second trigger to be tired according to the result of the flexible matching procedure.

In another representative embodiment, a system comprises an ADC configured to receive an analog input signal from a measurement target and convert the input signal into a digital signal, a matching unit comprising hardware configured to scan the digital signal and compare the scanned digital signal with a pattern signature using a flexible matching procedure, and a trigger configured to fire according to a result of the flexible matching procedure.

In some embodiments, the matching unit scans the digital signal in real-time as it exits the ADC and before it is stored in a memory. In some embodiments, the flexible matching procedure evaluates the digital signal with respect to a regular expression or fuzzy matching algorithm defining the pattern signature. In some embodiments, the trigger is configured to fire where the flexible matching procedure detects a mismatch between the digital signal and the pattern signature. The flexible matching procedure may be configured to repeatedly detect a match between the pattern signature and the digital signal where the digital signal is a periodic function.

BRIEF DESCRIPTION OF THE DRAWINGS

The described embodiments are best understood from the following detailed description when read with the accompanying drawing figures. Wherever applicable and practical, like reference numerals refer to like elements.

DETAILED DESCRIPTION

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical and scientific meanings of the defined terms as commonly understood and accepted in the technical field of the present teachings. As used in the specification and appended claims, the terms 'a', 'an' and 'the' include both singular and plural referents, unless the context clearly dictates otherwise. Thus, for example, 'a device' includes one device and plural devices.

The described embodiments relate generally to digital measurement instruments and related methods of operation. In certain embodiments, a digital measurement instrument generates new types of hardware based triggers or augments existing hardware triggers by comparing digitized measurement data against rules or pattern signatures, in real time, to discover when the measurement data produces certain types of expected or unexpected results. These comparisons can be accomplished, for instance, by scanning captured data in deep memory or as it leaves an ADC.

Figure 1:
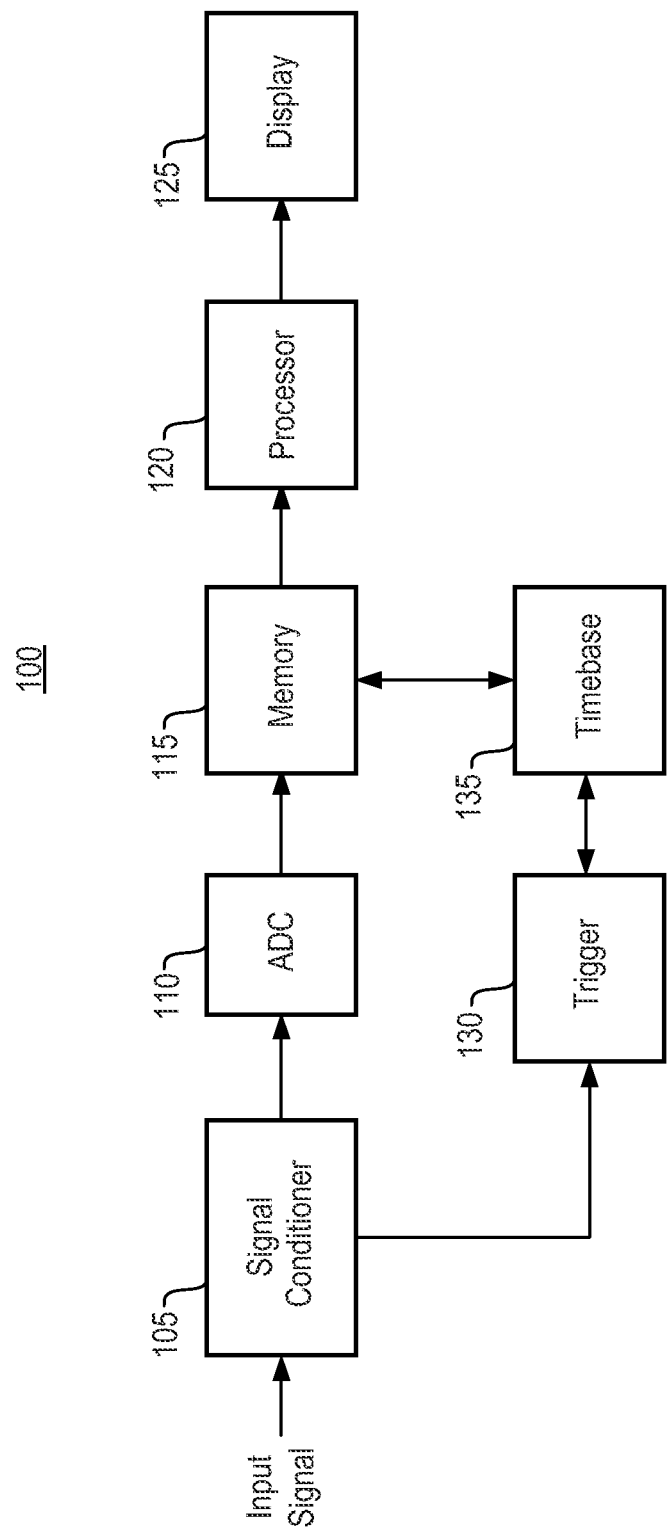
FIG. 1 is a block diagram illustrating an example of an oscilloscope.
Figure 2:
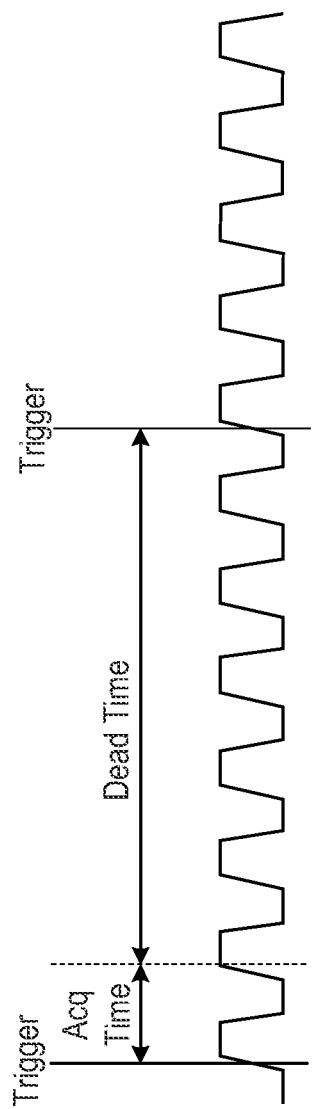
FIG. 2 is a waveform timing diagram illustrating the concept of dead time in an oscilloscope.

In certain embodiments, pattern signatures are or rules are compared to the digitized measurement data using a flexible matching mechanism such as a regular expression, an enhanced regular expression type language, a search algorithm such as Smith-Waterman or Needleman-Wunsch, or fuzzy matching such as Bitap. As used herein, the term "flexible matching" refers to a procedure in which a "match" can take various alternative forms. For example, a regular expression including a wildcard character can be matched by patterns of various different lengths or compositions. Similarly, a fuzzy matching algorithm or one of the above search algorithms may identify approximate matches of varying precision, subject to insertions or deletions in the matched patterns. The above and other flexible matching mechanisms can be implemented through the use of various hardware structures, such as a field programmable gate array (FPGA), an application specific integrated circuit (ASIC), or a finite state machine (FSM), for example. In addition, these and/or other hardware components can be implemented in place of or in addition to memory 115, processor 120, and/or trigger 130 of FIG. 1, although the representative embodiments are not limited to a specific hardware architecture.

Some of the described embodiments may address the above-mentioned performance limitations of existing triggering, such as relatively slow performance and/or dead time. Accordingly, these embodiments can be used as a replacement or supplement for existing triggers. In addition, the described embodiments may allow an increase in the number of active triggers used by a measurement instrument. They may also be used to represent more complex or longer trigger waveforms.

In the description that follows, certain embodiments are described with reference to oscilloscopes, and some potential benefits of these embodiments will be described with respect to oscilloscope performance. Nevertheless, the described concepts may find ready application in other types of digital measurement instruments such, logic analyzers, mass spectrometers, spectrum analyzers, and others.

In an oscilloscope, an input signal typically takes the form of voltage patterns (amplitude) that change over time. Accordingly, to recognize specific signal patterns using signatures or rules, it may be necessary to encode the signatures or rules as time varying voltage values. Such encoded signatures or rules may be used to detect, for instance, a glitch or a falling or rising edge, an anomalous eye diagram, signal reflections, runts, and other events. In addition, where an oscilloscope uses clock data recovery (CDR), it may be possible to use encoded signals or rules to locate valid or invalid patterns in clock recovered data. This can be used, for instance, to recreate a stream of binary data such as protocol data on a serial bus.

Many digital oscilloscopes contain software to analyze input data and perform measurements on captured voltage levels. Such measurements may include, for instance, root mean square (RMS) values, area under waveform, duty cycle, cycle width, undershoot and overshoot (ringing), rise time, period (frequency), peak to peak, minimum, maximum and average waveform values, and so on. In some digital oscilloscopes, these measurements are used by a software based trigger to determine when to capture a waveform. Such a trigger could be used, for instance, to help determine the source or root cause of any noise and, additionally, if anything should or can be done to eliminate that noise.

In certain embodiments described below, hardware based triggers are configured to fire based on measurements related to waveform shape and/or the matching of waveforms to predetermined shapes. A user could, for example, select a trigger to match a waveform having a certain frequency, peak-to-peak value, and a particular shape and inherent noise level. Where the trigger fires, the user may be able to observe a certain type of noise or other property of interest. Several of these triggers can be run by an oscilloscope to automatically eliminate or uncover certain common problems.

Figure 3:
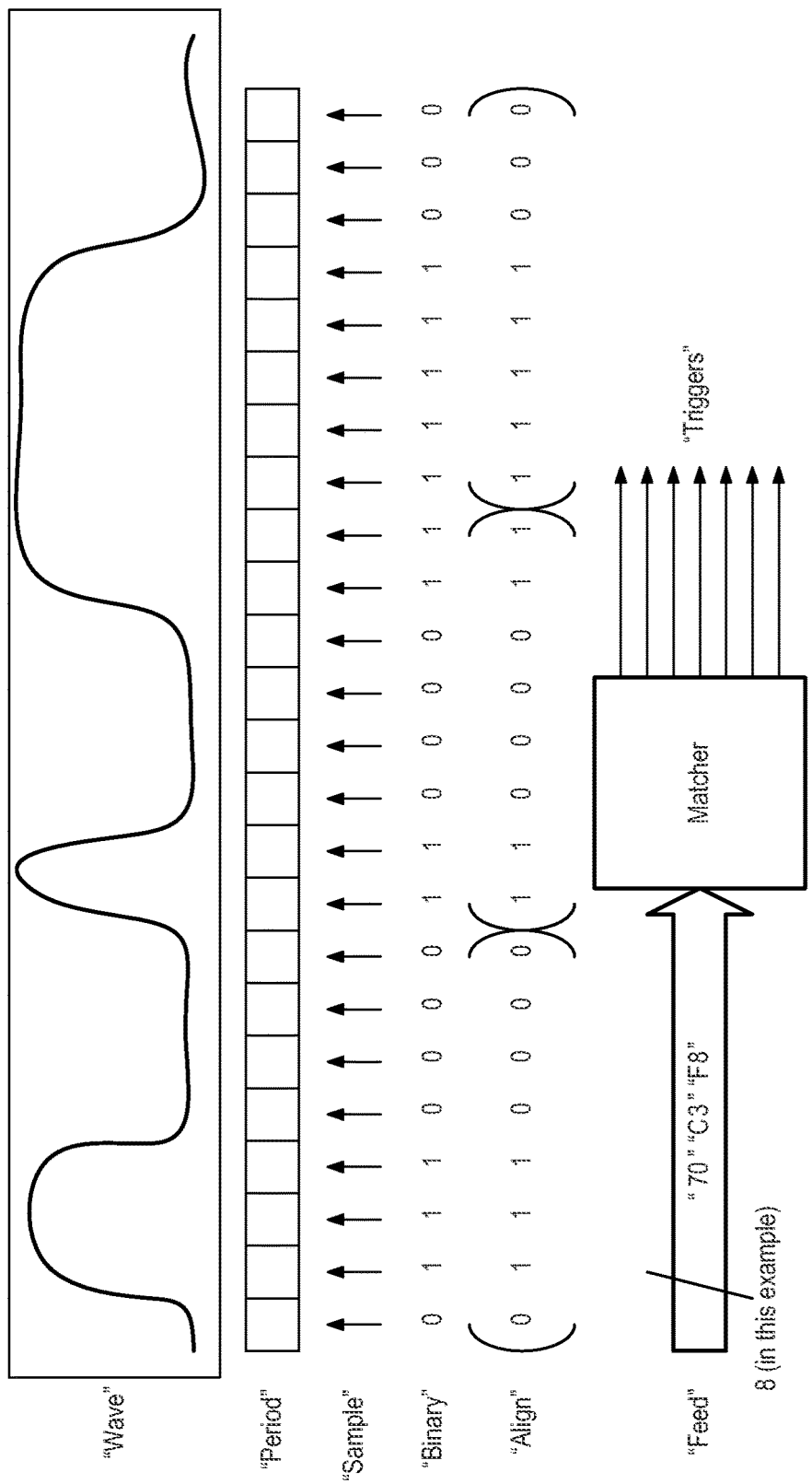
FIG. 3 is a conceptual diagram illustrating a method of triggering a measurement instrument according to a representative embodiment.

FIG. 3 is a conceptual diagram illustrating a method of triggering a measurement instrument according to a representative embodiment. In the example of FIG. 3, an analog input signal is sampled digitally to produce a binary data sequence, and the measurement instrument is triggered based on the matching of a binary pattern within the binary data sequence.

Referring to FIG. 3, the analog input signal comprises a waveform, labeled "Wave". A matching procedure examines the waveform over a period comprising a plurality of samples. This period, also referred to as the sample size, is indicated by a plurality of boxes labeled "Period", and each of the boxes corresponds to one of multiple samples labeled "Sample". In certain contexts, the timing of the sampling can be determined using some form of clock data recovery (CDR). Collectively, the samples taken over the designated period form a binary data sequence labeled "Binary". In the binary data sequence, each sample is assigned a first value (e.g., "1" or "high") where the waveform is greater than a predetermined threshold, and is assigned a second value (e.g., "0" or "low") where the waveform is less than or equal to the predetermined threshold.

Once the binary data sequence has been captured, it can be matched against one or more signatures using any of several matching procedures. Examples of such matching procedures are disclosed in U.S. patent application Ser. No. 13/600,112 filed Aug. 30, 2012, the subject matter of which is hereby incorporated by reference. In the example of FIG. 3, the matching is performed by first dividing the sequence into units of eight bits, as indicated by the label "Align", encoding the eight bit units as hexadecimal values (e.g., 70, C3, F8), and passing the encoded bits to a hardware based matching unit, labeled "Matcher". The matching unit determines whether the encoded bits match one or more of several designated signatures, and it generates one or more triggers upon identifying one or more corresponding matches.

In general, the matching procedure may use an exact matching approach or a flexible matching approach, according to user specification or design. Examples of the flexible matching approach include regular expressions, enhanced regular expression type languages, or search algorithms such as Smith-Waterman or Needleman-Wunsch, or fuzzy matching such as Wu-Manber, also known as Bitap or SHIFT-AND or SHIFT-OR Moreover, these and other pattern or string, matching techniques can be implemented in combination with each other to detect the presence or absence of multiple different signatures or types of different signatures within the binary data sequence. Additionally, the matching unit may operate multiple matching procedures in parallel in order to control multiple triggers at the same time, as indicated in FIG. 3 by the multiple arrows exiting the matching unit.

In embodiments using the described approach, the length of a signature, rule, or pattern to be matched against the binary data sequence may be proportional to the sample size or period length. For instance, suppose the period length is 100 samples, and the pattern to be recognized is a sine wave.

The sine wave pattern can be recognized by a regular expression that matches 100 samples in a sine wave configuration, plus or minus some unknown values to account for certain types of anomalies such as noise. The regular expression can also be terminated with a Kleene star to allow recurring recognition of a sine wave pattern.

Figure 4:
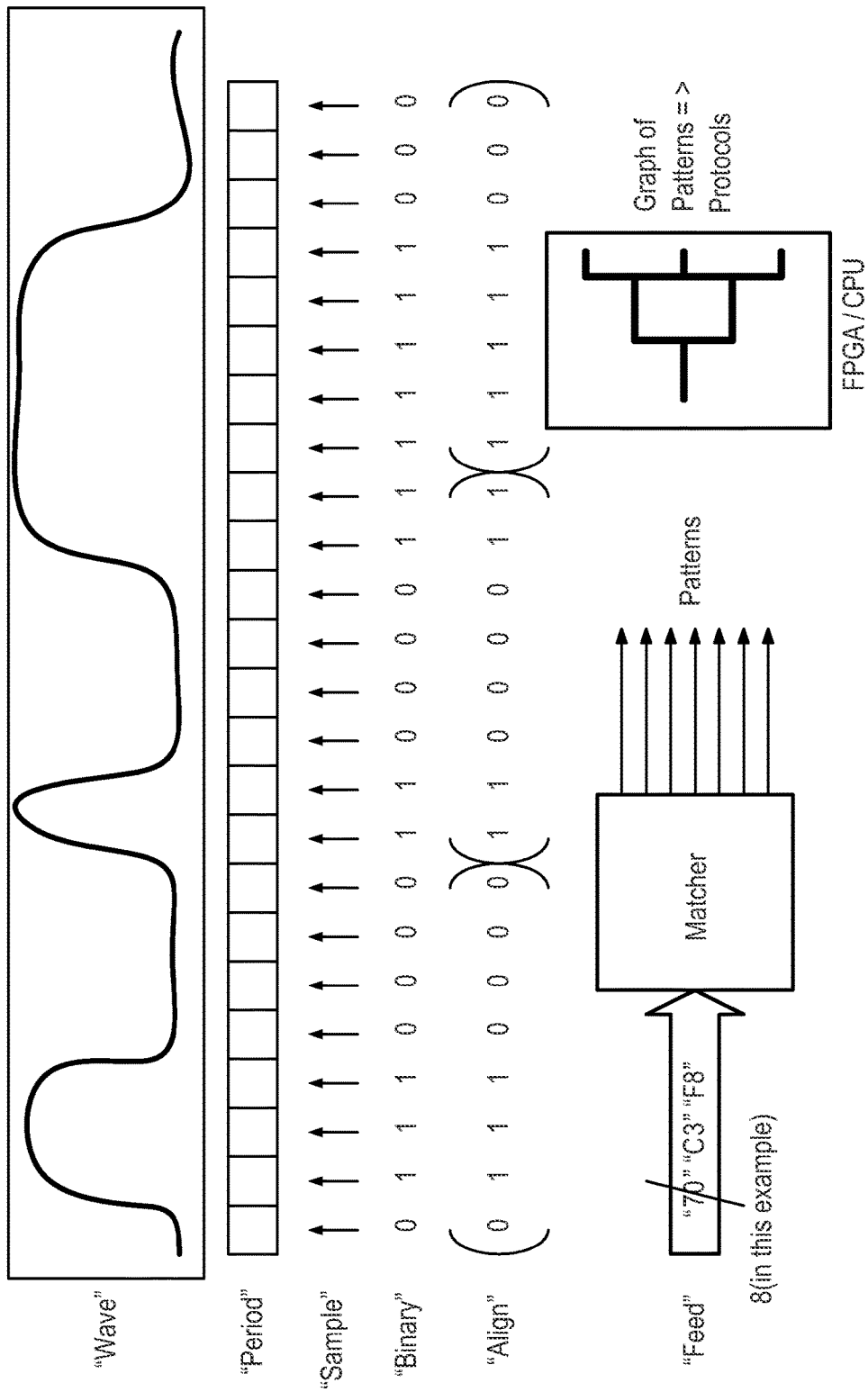
FIG. 4 is a conceptual diagram illustrating a method of triggering a measurement instrument according to another representative embodiment.

FIG. 4 is a conceptual diagram illustrating a method of triggering a measurement instrument according to another representative embodiment. The method of FIG. 4 is similar to that of FIG. 3, except that the measurement instrument is triggered upon detecting a match for several concurrent patterns within the binary data sequence. The matching of several concurrent patterns can be used, for instance, to trigger on a signal comprising a protocol suite, i.e., multiple protocols at different layers. For instance, it could be used to trigger on a protocol carrying either TCP or UDP over IP.

Referring to FIG. 4, the analog input signal is encoded as in the example of FIG. 3, and the encoded data is provided to the matching unit. The matching unit generates multiple output signals indicating matches to corresponding signatures, rules, patterns, etc. In other words, the output signals indicate the presence of such signatures, rules, patterns, etc., within the input signal. As in FIG. 3, the matches can be determined using exact or flexible matching approaches such as regular expressions, alignment algorithms, fuzzy matching and so on. Each of the output signals may be, for instance, a binary value indicating detection of one or more patterns.

The output signals are input to a second matching unit that determines whether the detected patterns indicate the presence of a certain protocol suite or some other feature of interest. Examples of techniques and technologies for recognizing such protocols and/or other features are disclosed in U.S. patent application Ser. No. 13/600,112. As indicated in FIG. 4, the second matching unit can be implemented using hardware such as an FPGA or CPU. In addition, although not shown in FIG. 4, the hardware implementing the second matching unit can be physically and/or logically integrated with the hardware implementing the first matching unit.

In the examples of FIGS. 3 and 4, there are various ways to represent patterns, signatures, or rules to be matched by the matching unit. One way is to determine the rate of change of digital data against time, and encode this rate with different lengths rules. The matching unit can then perform matching by identifying varying patterns of dv/dt, where v=voltage and t=time, or number of samples. In the context of an oscilloscope, for instance, a waveform is a visual display of amplitude versus time series of digitized values. The rise of an edge, for example, can be captured by how many samples it takes to get from below a certain value to above another.

Figure 5:
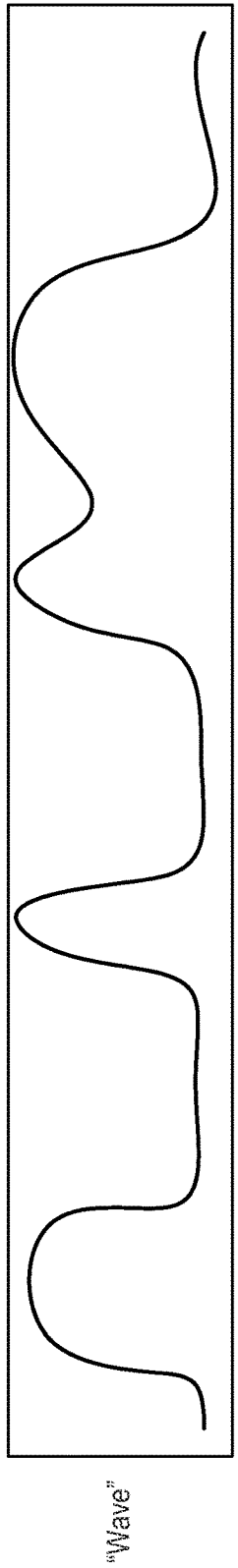
FIG. 5 is a conceptual diagram illustrating the use of a regular expression to identify a signal pattern in order to trigger a measurement instrument according to a representative embodiment.

FIG. 5 is a conceptual diagram illustrating the use of a regular expression to identify a signal pattern in order to trigger a measurement instrument according to a representative embodiment. For simplicity of explanation, the measurement instrument of FIG. 5 is assumed to have an 8-bit ADC, so it uses an 8-bit value to represent each sample of the analog input signal. For instance, an eight bit value "11111111" or "255" may represent a highest voltage level of the input signal, and an eight bit value "00000000" or "0" may represent a lowest voltage level of the input signal. In addition, it will also be assumed for simplicity that the measurement instrument uses the full range of the ADC, regardless of the incoming analogue data range, input attenuation or amplification.

Referring to FIG. 5, the input signal is illustrated by a waveform labeled "Wave". The input signal is digitized to produce a sequence of digital values, labeled "Digital Value". During typical operation, a matching unit, such as that illustrated in FIG. 3 or 4, analyzes the digital values to detect the presence of a signature pattern defined by a regular expression. These functions of the matching unit can be implemented by a deterministic FSM that uses a combination of a regular expression ranges to specify low and high values. Each of these ranges requires the value must be between '0' and some low threshold or above a certain high threshold.

Individual steps used to identify the signature pattern are shown in FIG. 5 by a "use case" description, labeled "Usecase". An example regular expression is shown below the use case description. In the example regular expression, a range expression [0-20] specifies the maximum and minimum voltage a low value can take and the sequence modifier '+' specifies that a matching pattern can have 'one or more' of these 'lows', resulting in a range expression [0-20]+. Within the FSM, a repeated transition to this 'low' state will be taken where an incoming value is equal to a value between 0 and 20. Otherwise, where the value is not between 0 and 20, the FSM will transition to a next state and evaluate the value with respect to the next range expression >{0,5}. If the next range expression is not satisfied, a trigger may fire to indicate a patient mismatch. In certain alternative embodiments, the FSM may transition back to an initial state without firing and again search for the range expression [0-20]+. In other words, in some embodiments the trigger may eventually fire in response to a pattern match rather than a pattern mismatch.

In the next state, the incoming value is evaluated based on a mathematical operator '>', which means the value must be greater than the last value observed, whatever that value may be. This allows the state machine to match a rising edge, for example. In the illustrated example, the sequence modifier is {0,5} rather than '+'. This sequence modifier indicates that the FSM must observe rising values for between 0 to 5 samples. In other words, the rise time to a next state should be 5 or less samples. If, for example, one sample is taken every 1 nanosecond then this means that the rise time must be less than 5 nanoseconds. If the measurement instrument's sample rate happens to be much higher, then the sequence modifier can be adjusted for the appropriate number of samples. Another alternative is to 'decimate' the values into the matching unit, but this threatens a loss of precision and may prevent identification of subtle features in the waveform. Nevertheless, decimation is noted as a possible way to produce a smaller sequence length in the presence of relatively fast sample rates.

In the next state, the FSM seeks one or more 'high' values above or equal to 235. Again a sequence modifier '+' is used to represent the one or more high values: [235-255]+. This is followed by the '<' operator indicating a decreasing value, and again a sequence modifier is between 0 and 5 indicating a fall time of 5 or less samples: <{0,5}. Finally, the regular expression includes a '*' sequence modifier which brackets the former expression specifying zero or more of the preceding expressions: ([0-20]+>{0,5}[235-255]+<{0,5})*.

In the example of FIG. 5, the regular expression matching causes the measurement instrument to trigger at a 'runt signal' represented by the voltage value 180. In other words, the regular expression matches the waveform until after the third set of 'high' values, and then it stops. In practice, such an event may indicate, for instance, that a device under test has a race condition with two or more paths to low/high.

In general, regular expressions can be used to represent a broad variety of constructs such as ranges, wildcards, alternates, concatenations, and various others. Nevertheless, the representative embodiments are not limited are not limited to regular expressions. For example, as indicated above, the matching unit can identify signature patterns using other fuzzy patient matching algorithms, such as Bitap pattern matching, local/global alignment tools, and so on.

Figure 6:
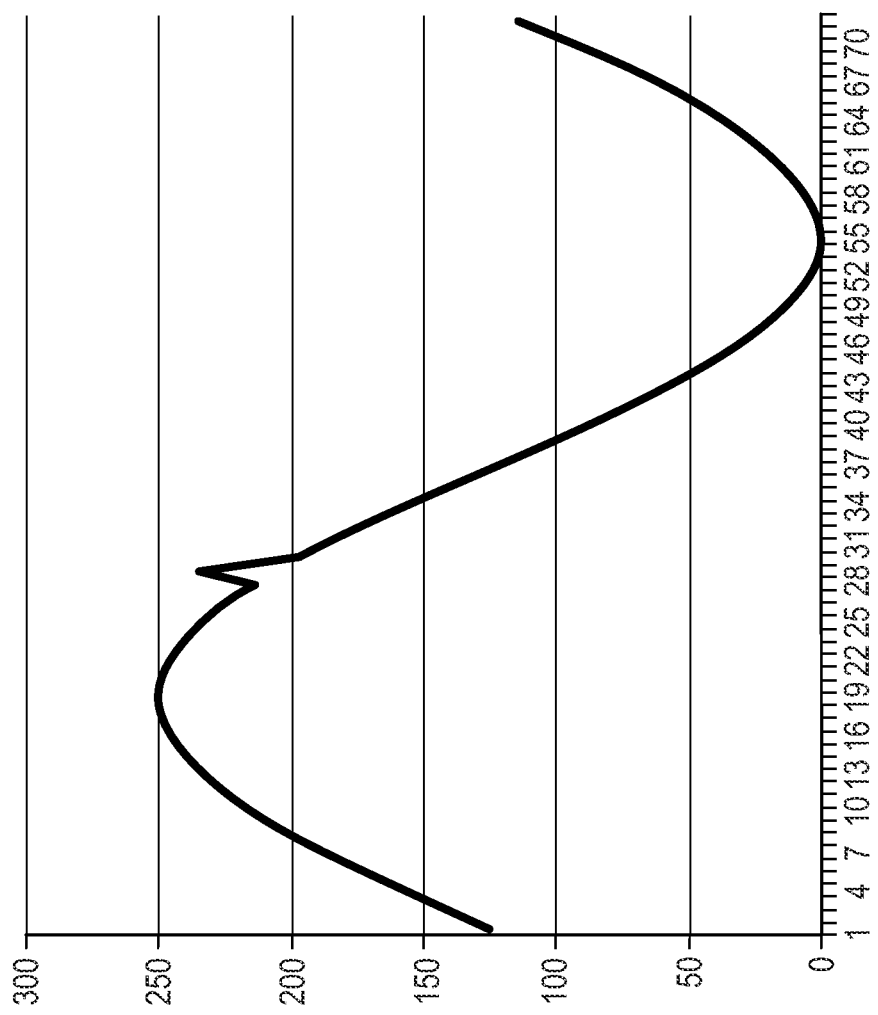
FIG. 6 is a voltage diagram illustrating a sine waveform with a glitch as an example of a signal pattern that can be detected to trigger a measurement instrument according to a representative embodiment.
Figure 7:
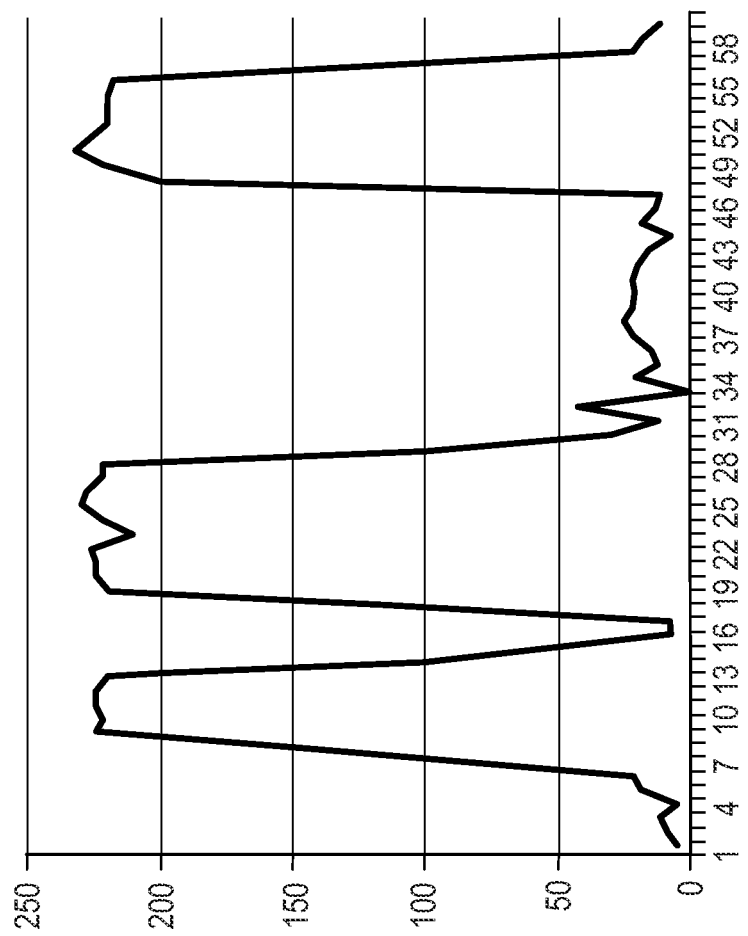
FIG. 7 is a voltage diagram illustrating ground bounce in a digital signal as another example of a signal pattern that can be detected to trigger a measurement instrument according to a representative embodiment.
Figure 8:
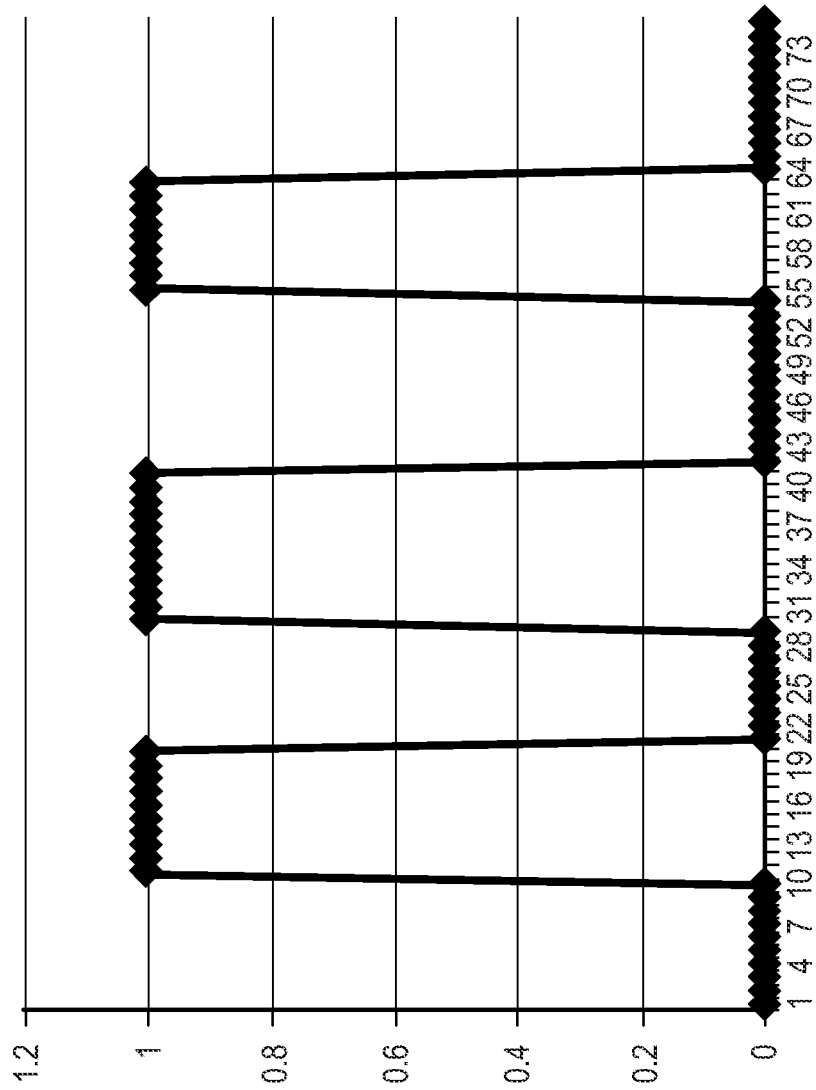
FIG. 8 is a voltage diagram illustrating jitter or wander in a clock signal as yet another example of a signal pattern that can be detected to trigger a measurement instrument according to a representative embodiment.

FIGS. 6 through 8 below illustrate the use of pattern matching in a measurement instrument to trigger on fairly common events. More specifically, FIG. 6 is a voltage diagram illustrating a sine waveform with a glitch as an example of a signal pattern that can be detected to trigger a measurement instrument according to a representative embodiment. FIG. 7 is a voltage diagram illustrating ground bounce in a digital signal as another example of a signal pattern that can be detected to trigger a measurement instrument according to a representative embodiment. FIG. 8 is a voltage diagram illustrating jitter or wander in a clock signal as yet another example of a signal pattern that can be detected to trigger a measurement instrument according to a representative embodiment.

Figure 9:
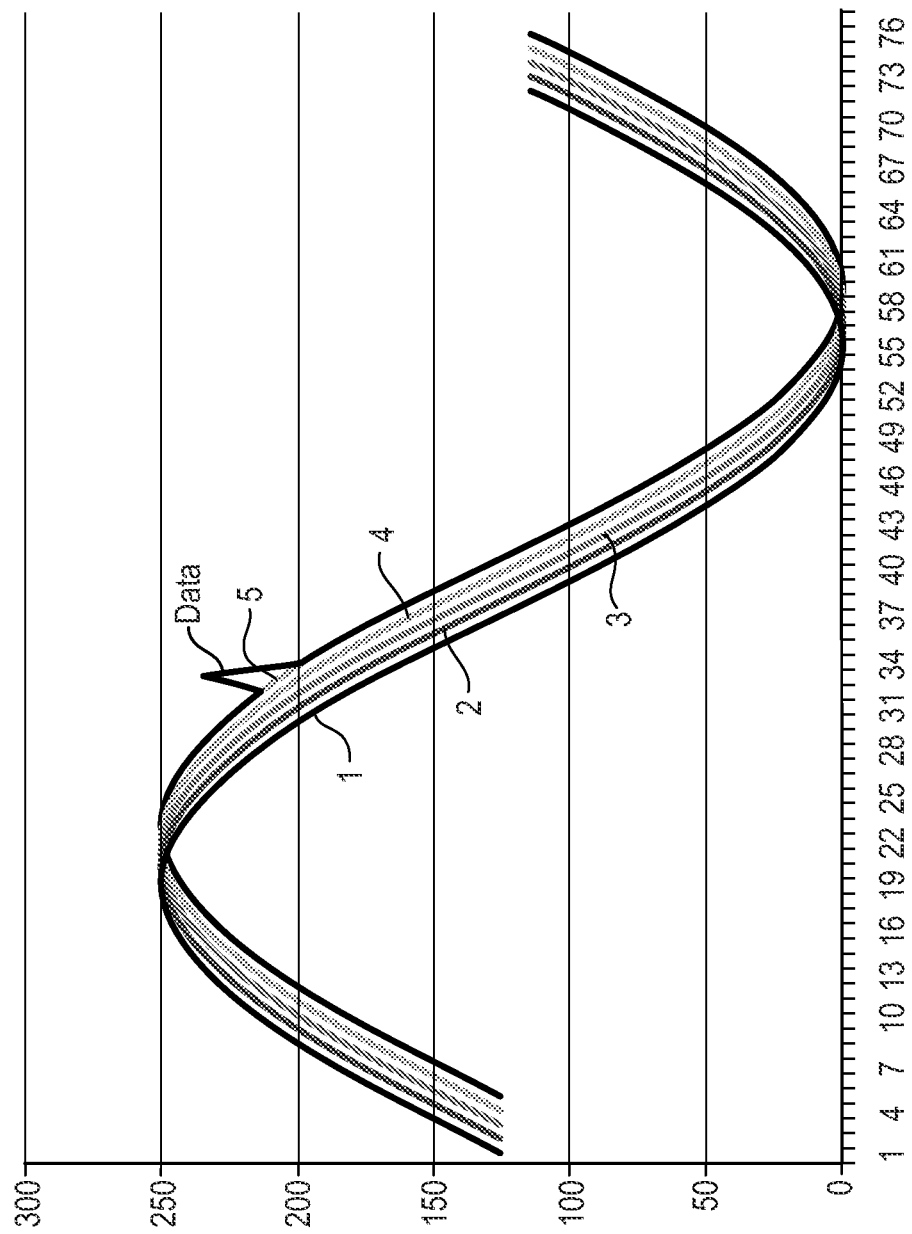
FIG. 9 is a voltage diagram illustrating a process for aligning a signal pattern template with an input signal for the purposes of aligning the waveform with a trigger and so arming the correct trigger of a measurement instrument according to a representative embodiment.

FIG. 9 is a voltage diagram illustrating a process for aligning a signal pattern template with an input signal of a measurement instrument according to a representative embodiment. This process is typically performed before pattern recognition in order to ensure that the start of the input signal's period is aligned with the start of the regular expression or other mechanism used for pattern recognition. It allows the measurement instrument to accurately track the input signal to detect glitches and other anomalous events, such as those illustrated in FIGS. 6 through 8. In the absence of such an alignment, false positives may occur.

Referring to FIG. 9, curves labeled "1" through "5" represent a signal pattern template at different temporal offsets, and a curve labeled "Data" represents an input signal to be tracked using the signal pattern template. At each of the different offsets shown in FIG. 9, the measurement instrument attempts to match the template with input signal. However, as illustrated in FIG. 9, a match occurs only with respect to the curve "5".

The process of aligning the signal pattern template with the input signal can be performed in a variety of ways. Various examples of different alignment approaches are described below.

In a first approach, the measurement instrument begins matching as if data were aligned with curve "1" and then tracks along 5 samples, curve by curve until it gets alignment with the input signal, i.e. it starts matching. At curve "5", the measurement instrument detects multiple positive matches, indicating that it is tracking correctly. In response to these positive matches, the measurement instrument may arm a trigger, and a subsequent mismatch between the input signal and the aligned signal pattern may cause the trigger to fire. Alternatively, if the aligned signal pattern (e.g., regular expression) is scanning a repetitive waveform, the measurement instrument may wait until one complete cycle of the waveform has passed before arming the trigger, to ensure a complete alignment.

One way to determine that the signal pattern template defines a repetitive waveform is by the presence of a Kleene star as an overall sequence modifier, for example, [0-10]* for any number of low transitions and. Another way is to allow the user to specify, e.g., through a user interface, that a repetitive waveform is to be expected.

The first approach process may work reliably as long as the signal pattern template (e.g., regular expression) does not match the input signal too loosely. For example, range expressions should not cover too wide a set of values, which can cause a false positive match before a true alignment occurs. Where only partial alignment has occurred, for example at curve "4", then tracking one full cycle before arming the trigger may improve the alignment. However, if alignment were off by one sample, at curve "4" but had matched several samples already because of breadth included in the signal pattern template to allow for slightly noisy waveforms, the measurement instrument could shift along by one and continue the alignment procedure. By adding a small skip in this manner it may improve the likelihood of a true alignment without having to match several waveforms repetitions each time restarting the scanning.

In a variation of the first approach, several signal pattern templates may be concurrently matched against the input signal. In other words, multiple templates may be active at the same time. These templates can be shifted by one sample along the input signal until the waveform repeats, or at least as far along as possible with in constraints of the hardware and memory in the measurement instrument. Multiple active templates provide a 'sliding window' of expressions, performing the alignment in parallel'. Where one instance of the templates is successfully tracking the waveform, curve "5", the measurement instrument arms the instance of the expression and disregards all the others so that only the active template will cause the trigger to fire where the input signal moves outside the specified values. As many waveforms have natural trigger points such as square and binary waves, alignment should be relative easy to obtain for these waveforms.

In a second approach, pattern matching triggers may be armed in response to existing hardware triggers. Under these circumstances, pattern matching can still be physically close to the input signal, and it can still be run at hardware speed and therefore avoid missing significant amounts of data due to 'blind' time once they have initially obtained alignment. Similarly, various other options to obtain an alignment are available, such as having a small separate functional block that detects where a waveform crosses zero, has an edge, or edge to edge, hits a minimum or a maximum and then arm the trigger.

In a third approach, an alignment algorithm can be used prior to hardware based pattern matching. As an example, the Smith-Waterman algorithm can be used to detect local alignments between a noisy input signal and a signal pattern template. A possible shortcoming of this approach is that the Smith-Waterman algorithm may be computationally expensive and may be somewhat slow in returning a result.

As indicated by the foregoing, in certain embodiments, a measurement instrument can be triggered based on flexible pattern matching performed in hardware. The flexible pattern matching can be implemented, for instance, by regular expressions, fuzzy matching, local alignment algorithms, or various other techniques. These and other embodiments can potentially improve, among other things, the speed, accuracy, sensitivity, and flexibility of triggering operations.

While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

The invention claimed is:

1. A method of operating a measurement instrument, the method comprising:

receiving an analog input signal from a measurement target;

converting, with an analog-to-digital converter (ADC), the input signal into a digital signal comprising a binary data sequence;

scanning the digital signal and comparing the scanned digital signal with a pattern signature using a matching procedure; and triggering the measurement instrument upon detecting a match for several concurrent patterns within the binary data sequence.

2. The method of claim 1, wherein the digital signal is scanned in real-time as it exits the ADC.

3. The method of claim 2, wherein the digital signal is scanned prior to storage in a memory.

4. The method of claim 1, wherein the digital signal is stored in a deep memory of the measurement instrument and scanned in the deep memory.

5. The method of claim 1, wherein the matching procedure comprises evaluating the digital signal with respect to a regular expression defining the pattern signature.

6. The method of claim 5, wherein the regular expression has a length proportional to a number of digital samples in a portion of the scanned digital signal to be matched by the matching procedure.

7. The method of claim 1, wherein the matching procedure aligns the digital signal with the pattern signature using a local alignment algorithm.

8. The method of claim 7, wherein the local alignment algorithm is a Smith-Waterman algorithm or a Needleman-Wunsch algorithm.

9. The method of claim 1, wherein the digital words of the digital signal represent time-sequence voltages.

10. The method of claim 1, further comprising determining a phase alignment of the matching procedure relative to the digital signal, and arming a trigger of the measurement instrument upon achieving successful phase alignment.

11. The method of claim 10, wherein determining the phase alignment of the matching procedure comprises comparing multiple instances of the pattern signature with the digital signal to identify an instance having phase alignment with the signal pattern, wherein the instances of the pattern signature are phase-shifted with respect to each other.

12. The method of claim 11, wherein the instances of the pattern signature are compared with the digital signal in parallel.

13. The method of claim 1, further comprising triggering the measurement instrument upon detecting a mismatch between the pattern signature and the digital signal.

14. The method of claim 1, further comprising arming a first trigger to be fired in response to a first event detected by the measurement instrument, and in response to the arming of the first trigger, arming a second trigger to be fired according to a result of the matching procedure.

15. The method of claim 1, wherein the pattern signature is defined in terms of a rate of change (dv/dt) of digital data against time, and the matching procedure performs matching by identifying patterns of the rate of change in the digital signal.

16. A system comprising:

an analog to digital converter (ADC) configured to receive an analog input signal from a measurement target and convert the input signal into a digital signal comprising a binary data sequence;

a matching unit configured to scan the digital signal and compare the scanned digital signal with a different characteristic of a pattern signature using a matching procedure; and a trigger device configured to generate a triggering signal upon detecting a match for several concurrent patterns within the binary data sequence.

17. The system of claim 16, wherein the matching unit scans the digital signal in real-time as it exits the ADC and before it is stored in a memory.

18. The system of claim 16, wherein the matching procedure evaluates the digital signal with respect to a regular expression or fuzzy matching algorithm defining the pattern signature.

19. The system of claim 16, wherein the trigger device is configured to generate the triggering signal where the matching procedure detects a mismatch between the digital signal and the pattern signature.

20. The system of claim 16, wherein the matching procedure is configured to repeatedly detect a match between the pattern signature and the digital signal where the digital signal is a periodic function.

* * * * *